United States Patent
Regimbal et al.

(10) Patent No.: US 9,918,408 B2
(45) Date of Patent: Mar. 13, 2018

(54) METHOD AND APPARATUS TO MANAGE COOLANT PRESSURE AND FLOW FOR AN ARRAY OF LIQUID SUBMERGED ELECTRONIC DEVICES

(71) Applicant: LiquidCool Solutions, Inc., Rochester, MN (US)

(72) Inventors: Laurent Regimbal, Round Rock, TX (US); Sean Archer, Rochester, MN (US); Steve Shafer, Rochester, MN (US); Lyle R. Tufty, Rochester, MN (US)

(73) Assignee: LIQUIDCOOL SOLUTIONS, INC., Rochester, MN (US)

( * ) Notice: Subject to any disclaimer, the term of this patent is extended or adjusted under 35 U.S.C. 154(b) by 0 days.

(21) Appl. No.: 15/240,309

(22) Filed: Aug. 18, 2016

(65) Prior Publication Data

US 2016/0360649 A1   Dec. 8, 2016

Related U.S. Application Data

(63) Continuation of application No. 14/036,307, filed on Sep. 25, 2013, now Pat. No. 9,451,726.
(Continued)

(51) Int. Cl.
H05K 7/20   (2006.01)

(52) U.S. Cl.
CPC ......... *H05K 7/20636* (2013.01); *H05K 7/207* (2013.01); *H05K 7/20236* (2013.01);
(Continued)

(58) Field of Classification Search
CPC ............... H05K 7/20236; H05K 7/203; H05K 7/20627–7/2069; H05K 7/20763–7/20827
See application file for complete search history.

(56) References Cited

U.S. PATENT DOCUMENTS 3,283,808 A   11/1966   Hochstrasser
3,485,534 A   12/1969   Wanzenberg et al.
(Continued)

FOREIGN PATENT DOCUMENTS

JP   1999-89213   3/1999
JP   2011-518395   6/2011
(Continued)

OTHER PUBLICATIONS

International Search Report for PCT/US2013/061565, dated Jan. 17, 2014 (3 pages).
(Continued)

*Primary Examiner* — Robert J Hoffberg
(74) *Attorney, Agent, or Firm* — Hamre, Schumann, Mueller & Larson, P.C.

(57) ABSTRACT

A fluid delivery system configuration is described for use with an array of liquid submersion cooled electronic devices disposed in a rack, such as an array of liquid submerged servers. The fluid delivery system allows for the pumping system to generate pressure and flow of the cooling system fluid at slightly higher levels than is necessary for the worst case device/position within the array and to provide for uniformity of delivery pressure and coolant flow to each and every device within the array.

6 Claims, 9 Drawing Sheets

Related U.S. Application Data

(60) Provisional application No. 61/705,409, filed on Sep. 25, 2012.

(52) U.S. Cl.
CPC ..... *H05K 7/20272* (2013.01); *H05K 7/20772* (2013.01); *H05K 7/20781* (2013.01)

(56) References Cited

U.S. PATENT DOCUMENTS

| | | |
|---|---|---|
| 4,445,629 A | 5/1984 | Doerfler |
| 4,493,010 A | 1/1985 | Morrison et al. |
| 5,523,028 A | 6/1996 | Reens et al. |
| 5,740,018 A | 4/1998 | Rumbut, Jr. |
| 6,828,675 B2 | 12/2004 | Memory et al. |
| 7,050,299 B2 | 5/2006 | Kondo et al. |
| 7,318,322 B2 | 1/2008 | Ota et al. |
| 7,355,852 B2 | 4/2008 | Pfahnl |
| 7,380,409 B2 | 6/2008 | Campbell et al. |
| 7,420,804 B2 | 9/2008 | Leija et al. |
| 7,466,549 B2 | 12/2008 | Dorrich et al. |
| 7,639,499 B1 | 12/2009 | Campbell et al. |
| 7,675,748 B2 | 3/2010 | Matsushima et al. |
| 7,885,070 B2 | 2/2011 | Campbell et al. |
| 7,905,106 B2 | 3/2011 | Attlesey |
| 7,911,793 B2 | 3/2011 | Attlesey |
| 7,944,694 B2 | 5/2011 | Campbell et al. |
| 7,946,383 B2 | 5/2011 | Lynch |
| 7,961,475 B2 | 6/2011 | Campbell et al. |
| 7,978,472 B2 | 7/2011 | Campbell et al. |
| 7,983,040 B2 | 7/2011 | Campbell et al. |
| 8,035,972 B2 | 10/2011 | Ostwald et al. |
| 8,089,764 B2 | 1/2012 | Attlesey |
| 8,089,766 B2 | 1/2012 | Attlesey |
| 8,164,901 B2 | 4/2012 | Neudorfer |
| 8,240,165 B2 | 8/2012 | Novotny |
| 8,467,189 B2 | 6/2013 | Attlesey |
| 8,522,569 B2 | 9/2013 | Avery et al. |
| 8,654,529 B2 | 2/2014 | Attlesey |
| 9,451,726 B2 * | 9/2016 | Regimbal ........... H05K 7/20236 |
| 9,629,281 B2 * | 4/2017 | Mullady ............ H05K 7/20281 |
| 2007/0256957 A1 | 11/2007 | Herrmann et al. |
| 2008/0016887 A1 | 1/2008 | Locke et al. |
| 2010/0134972 A1 | 6/2010 | Moss |
| 2011/0026225 A1 | 2/2011 | Ostwald et al. |
| 2011/0240281 A1 | 10/2011 | Avery |
| 2011/0258925 A1 | 10/2011 | Baker |
| 2011/0286177 A1 | 11/2011 | Attlesey |
| 2011/0315353 A1 | 12/2011 | Campbell et al. |
| 2012/0075796 A1 | 3/2012 | Attlesey |
| 2012/0075797 A1 | 3/2012 | Attlesey |
| 2012/0118534 A1 | 5/2012 | Goth et al. |
| 2013/0081790 A1 | 4/2013 | Tufty et al. |
| 2013/0081791 A1 | 4/2013 | Tufty et al. |
| 2013/0081792 A1 | 4/2013 | Tufty et al. |
| 2013/0083479 A1 | 4/2013 | Tufty et al. |
| 2013/0340427 A1 | 12/2013 | Gonzalez Delgado et al. |
| 2014/0083647 A1 | 3/2014 | Army, Jr. et al. |
| 2014/0233175 A1 | 8/2014 | Demange et al. |
| 2014/0238516 A1 | 8/2014 | Demange et al. |
| 2015/0138723 A1 | 5/2015 | Shedd et al. |
| 2015/0189796 A1 | 7/2015 | Shedd et al. |
| 2015/0208549 A1 | 7/2015 | Shedd et al. |
| 2015/0230366 A1 | 8/2015 | Shedd et al. |
| 2015/0237767 A1 | 8/2015 | Shedd et al. |
| 2015/0237303 A1 | 9/2015 | Shedd et al. |
| 2016/0007503 A1 * | 1/2016 | Druzhinin ................ G06F 1/20 361/699 |
| 2016/0366792 A1 * | 12/2016 | Smith ..................... G06F 1/20 |
| 2017/0127575 A1 * | 5/2017 | Lunsman ............... F16L 37/12 |

FOREIGN PATENT DOCUMENTS

| | | | |
|---|---|---|---|
| WO | 2009131810 | 10/2009 | |
| WO | WO 2016053260 A1 * | 4/2016 | ............. G06F 1/181 |

OTHER PUBLICATIONS

Written Opinion for PCT/US2013/061565, dated Jan. 17, 2014 (6 pages).

Japanese Office Action issued corresponding Japanese Application No. 2015-534614 dated Jul. 27, 2017 (7 pages)—English Translation.

* cited by examiner

METHOD AND APPARATUS TO MANAGE COOLANT PRESSURE AND FLOW FOR AN ARRAY OF LIQUID SUBMERGED ELECTRONIC DEVICES

FIELD

This disclosure relates to liquid submersion cooling of electronic array systems, for example liquid submerged server (LSS) computers; blade servers; disk arrays/storage systems; solid state memory devices; storage area networks; network attached storage; storage communication systems; routers; telecommunication infrastructure/switches; wired, optical and wireless communication devices; cell processor devices; printers; power supplies; etc.

BACKGROUND

When an array of liquid submersion cooled electronic devices is deployed, a fluid distribution system providing interconnection between the devices in the array and a coolant pump for the liquid are necessary. One example of an array of liquid submersion cooled electronic devices is an array of liquid submerged servers (LSS's) arranged in a rack system. An example of an array of LSS's in a rack system is disclosed in U.S. Pat. Nos. 7,905,106, 7,911,793, and 8,089,764.

For a liquid submersion cooled electronic device in the array to function optimally, the liquid coolant should be delivered to the device within a specific range of flow rates and pressures. The arrangement of the devices in the rack and the design of the fluid distribution system itself make the delivery of the coolant at the required flow rates and pressures difficult due to variables such as pressure losses due to elevation in the rack (static head) and cumulative pressure drops due to frictional losses along the flow path of the fluid for each location/device within the array of devices.

SUMMARY

A fluid delivery system configuration is described for use with an array of liquid submersion cooled electronic devices disposed in a rack. The fluid delivery system allows for the pumping system to generate pressure and flow of the cooling system fluid at slightly higher levels than is necessary for the worst case device/position within the array (i.e. those devices within the array which are at the highest elevation and/or experiencing the greatest pressure drops and flow reductions due to their remote proximity relative to the pump) and to provide for uniformity of delivery pressure and coolant flow to each and every device within the array. Managing the flow and pressure of the cooling liquid helps to achieve proper cooling of devices in the array, and helps to prevent damage to devices that are being submersion cooled in the array.

One exemplary application of the fluid delivery system is for use with an array of LSS's arranged in a rack system. However, the concepts of the fluid delivery system described herein can be used in other applications where arrays of electronic devices are liquid submersion cooled, including, but not limited to, blade servers, disk arrays/storage systems, solid state memory devices, storage area networks, network attached storage, storage communication systems, routers, telecommunication infrastructure/switches, wired, optical and wireless communication devices, cell processor devices, printers, power supplies, etc.

As indicated above, each electronic device in the array sees generally the same pressure no matter where the device is located in the array. In addition, the fluid pressure is preferably generally constant despite changes in pump speed. For example, when the pump speed is low or at a minimum speed, generally a first fluid pressure is provided to each electronic device. When the pump speed is high or at a maximum speed, a second fluid pressure is also provided to each electronic device. The first and second fluid pressures vary by a relatively minimal amount or in some embodiments can even be equal to one another.

The fluid delivery system can have any configuration suitable for achieving the uniform pressure delivery. The fluid delivery system can include elements such as a pump(s), filter(s), heat exchanger(s), fluid manifolds, fluid passageways, and the like. Each element in the fluid delivery system through which the fluid flows creates a flow restriction impacting delivery pressure. The fluid delivery system described herein is designed so that the various flow restrictions provided by the various elements thereof results in the internal gauge pressure of the electronic devices being regulated, reducing the range in pressure change with respect to changes in pump speed. This will protect the enclosures of the electronic devices, which are sealed enclosures, and allow for simplified "pressure vessel" design of the enclosures.

In one embodiment, a system includes an array of electronic devices, with the array including at least two vertical levels and each vertical level including at least two of the electronic devices that are configured for liquid submersion cooling by a cooling liquid. In addition, a fluid delivery system delivers cooling liquid to the electronic devices. The fluid delivery system is configured to generate pressure and flow of the cooling liquid at slightly higher levels than is necessary for the worst case electronic device position within the array and to provide for substantially uniform cooling liquid pressure delivery to every electronic device within the array.

In another embodiment, a method of cooling an array of electronic devices using liquid submersion in a cooling liquid is provided. The array of electronic devices is arranged into at least two vertical levels and each vertical level includes at least two of the electronic devices. The method includes providing a fluid delivery system that delivers coolant liquid to the electronic devices in each vertical level, and configuring the fluid delivery system to generate pressure and flow of the cooling liquid at slightly higher levels than is necessary for the worst case electronic device position within the array and to provide for substantially uniform cooling liquid pressure and flow delivery to every electronic device within the array.

In another embodiment, a fluid delivery system is provided that is configured to deliver cooling liquid to a plurality of liquid submersion cooled electronic devices disposed on different vertical levels of a rack. The fluid delivery system can include a cooling liquid delivery manifold and a cooling liquid return manifold at each vertical level of the rack, with each cooling liquid delivery manifold and cooling liquid return manifold being configured to connect to a plurality of the electronic devices at the respective vertical level. The system can also include a bypass line fluidly connecting the cooling liquid delivery manifold and the cooling liquid return manifold at each vertical level, and a pressure and/or flow regulating device that locally regulates pressure and/or flow through the bypass line.

DRAWINGS

Figure 9:
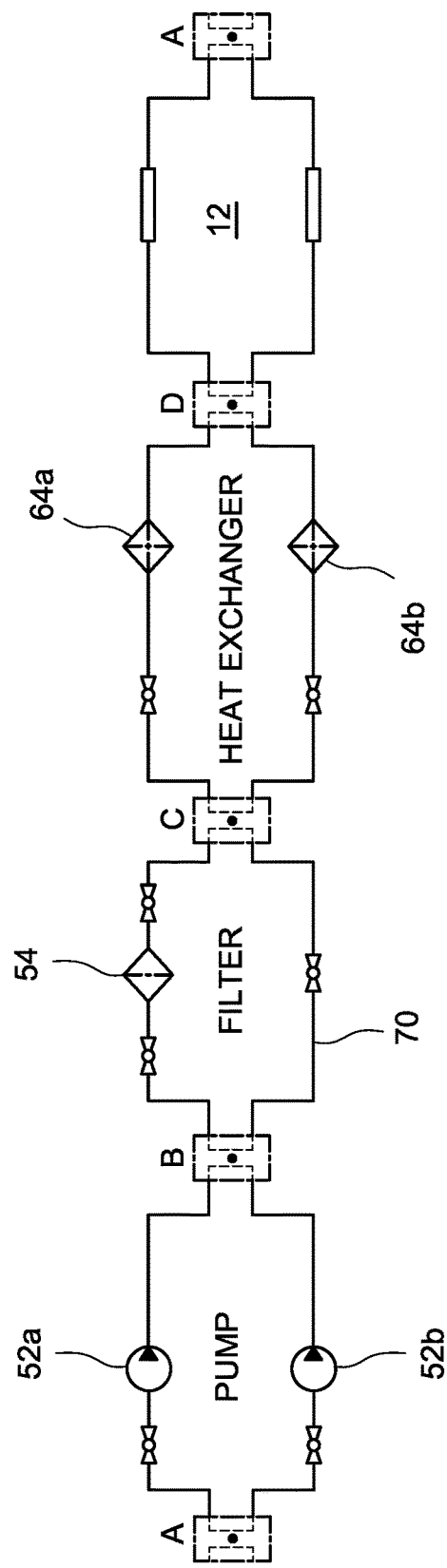

FIG. 9 a schematic diagram of the coolant distribution unit fluidly connected to the array.

Figure 3:
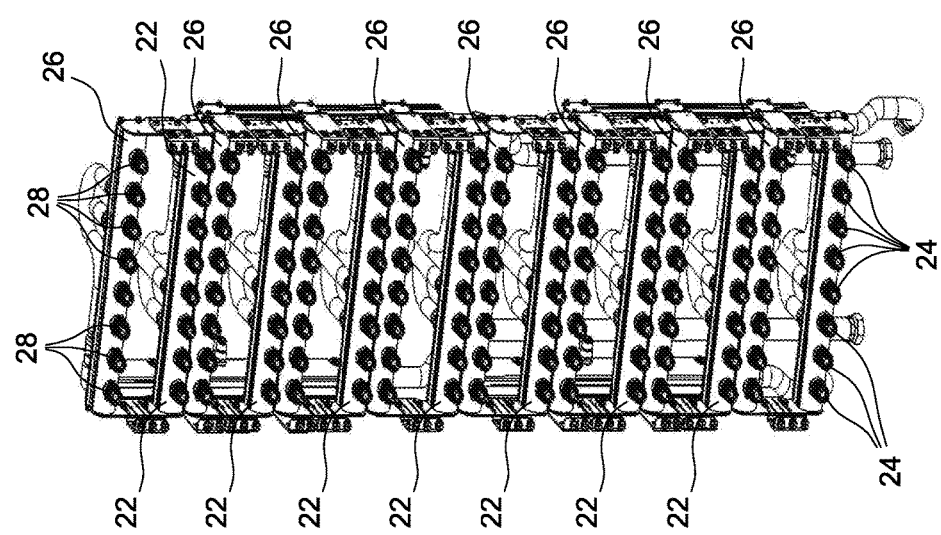
FIG. 3 is a front perspective view of a portion of the fluid delivery system with the LSS's removed.
Figure 6:
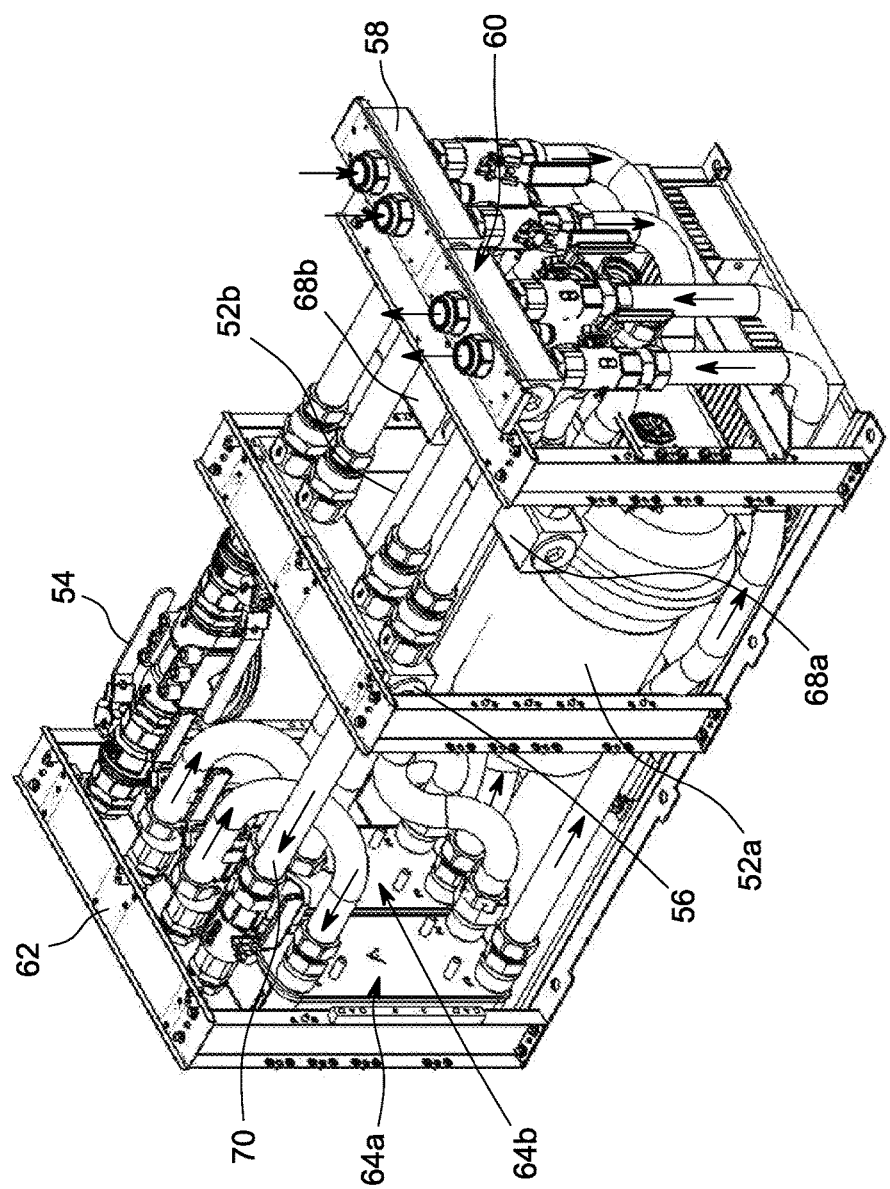
FIG. 6 is a perspective view of a coolant distribution unit of the fluid delivery system with an enclosure case removed to show the interior of the unit.
Figure 7:
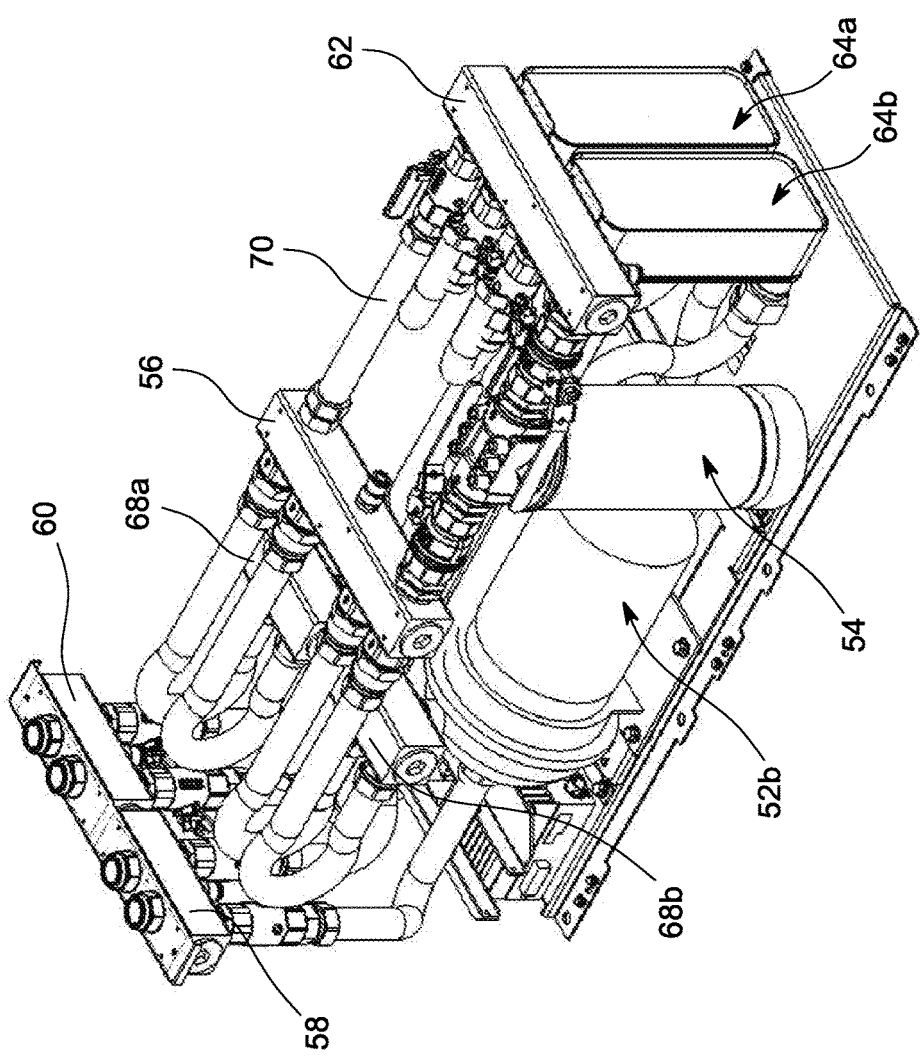
FIG. 7 is a front perspective view of the coolant distribution unit of FIG. 6 with support structure of the unit removed for clarity.
Figure 8:
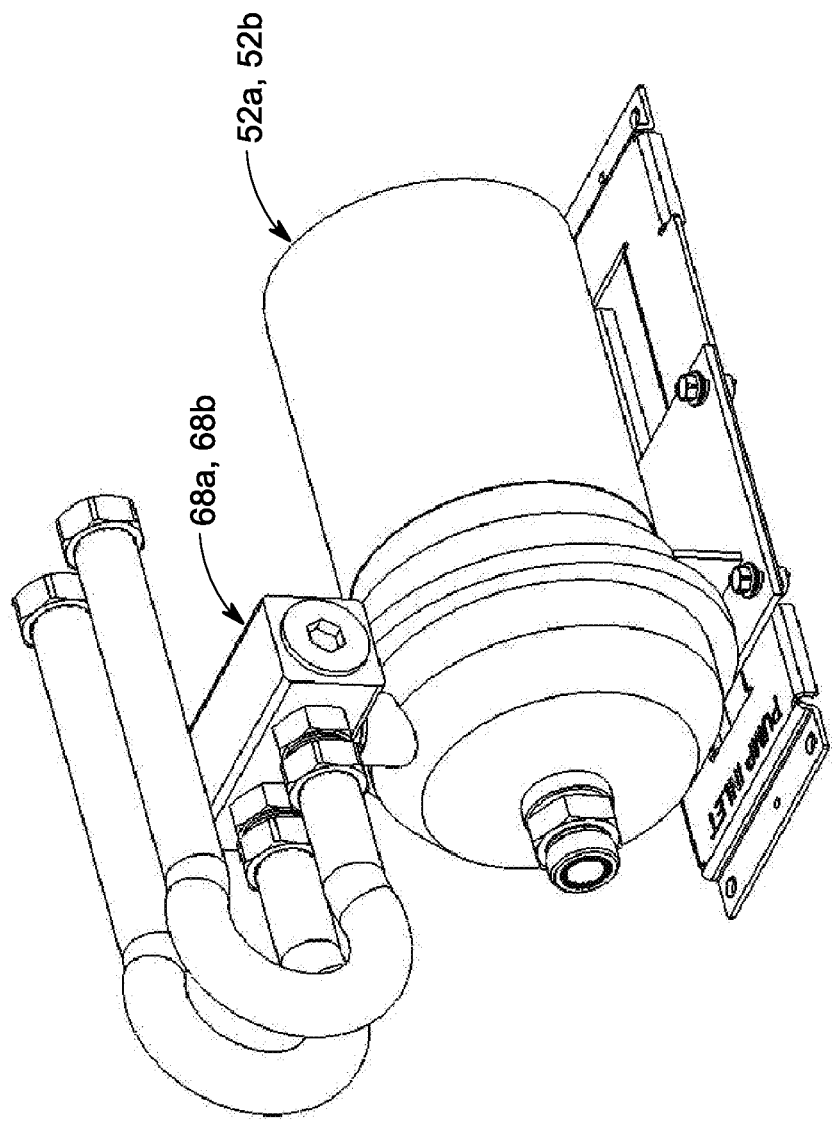
FIG. 8 illustrates one of the pumps of the coolant distribution unit and a distribution manifold connected to the pump outlet.
Figure 10:
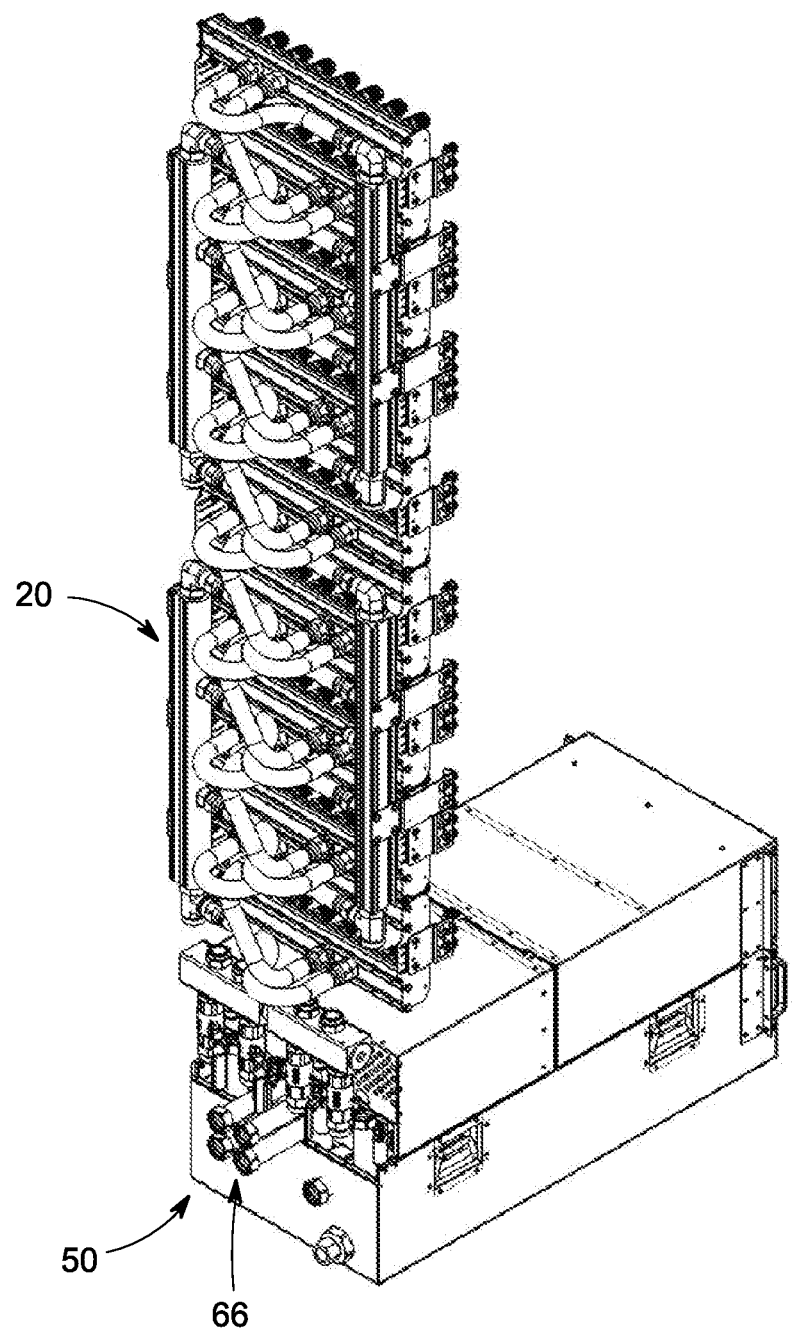

FIG. 10 is a perspective view showing the portion of the fluid delivery system of FIG. 3 and how in use it would be positioned relative to the coolant distribution unit of FIG. 6.

DETAILED DESCRIPTION

Figure 1:
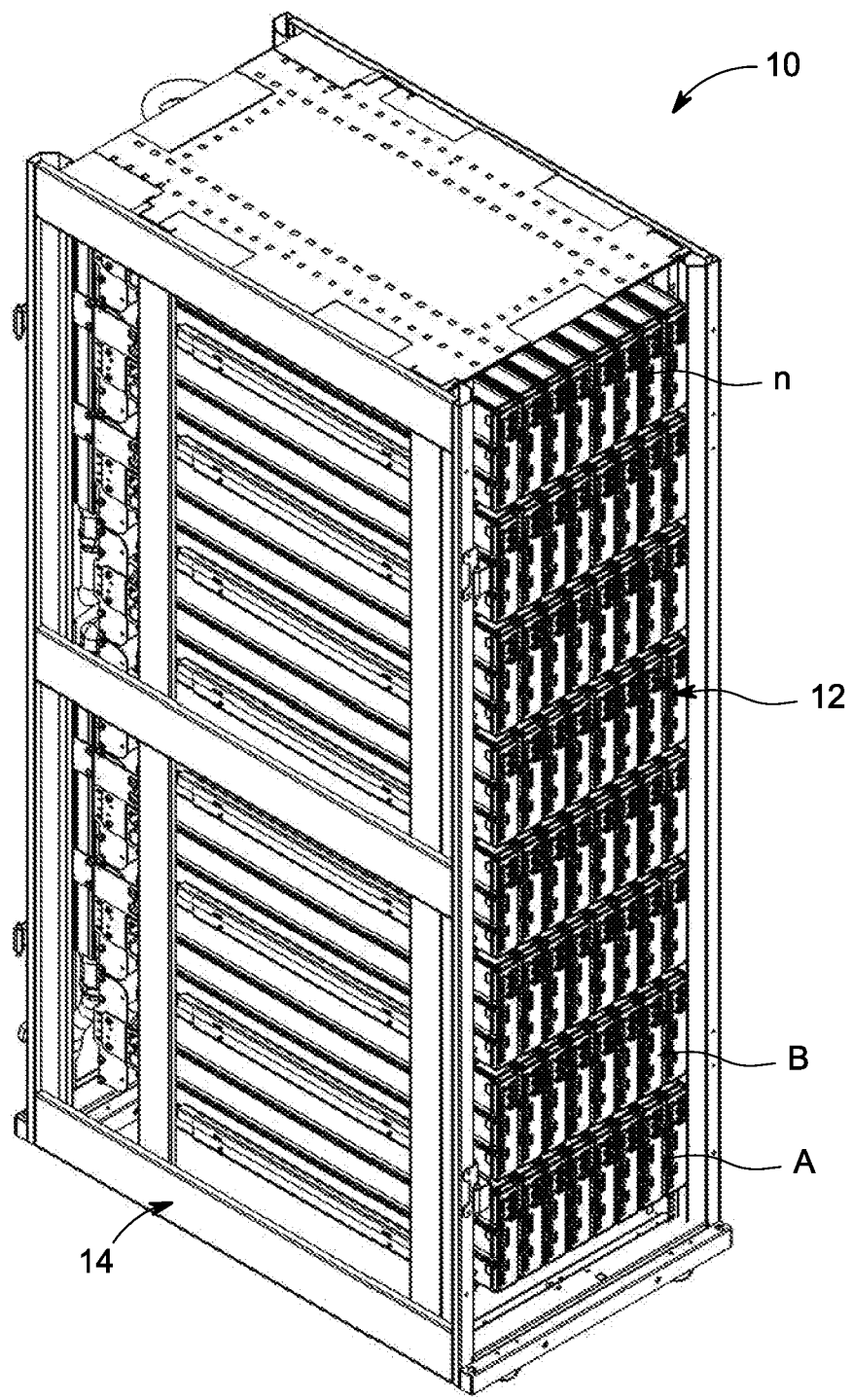
FIG. 1 is a front perspective view of a rack mounted array of LSS's fluidly connected to the fluid delivery system described herein.
Figure 2:
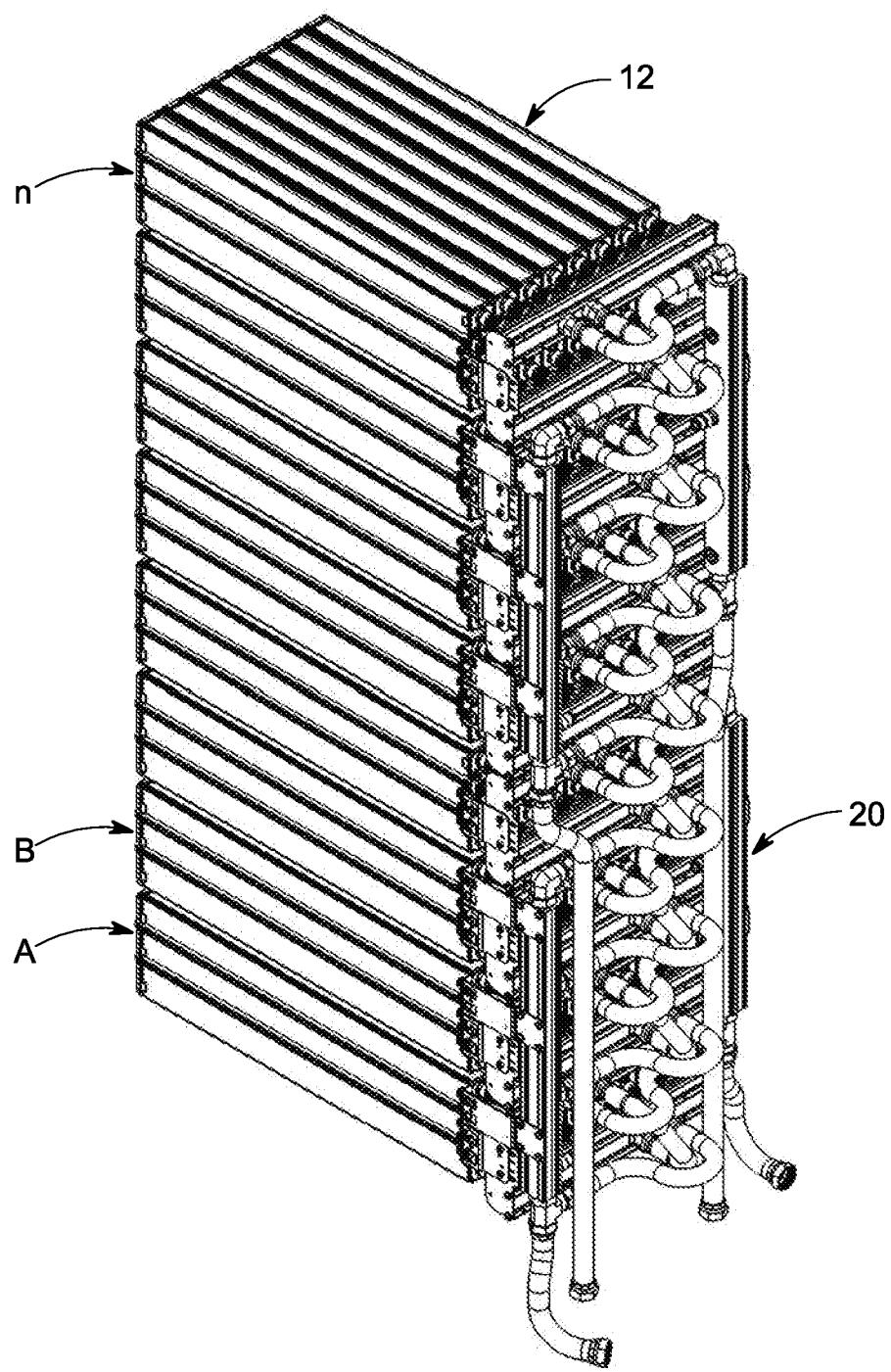
FIG. 2 is a rear perspective view of the array of LSS's without the associated rack structure being shown.

FIGS. 1 and 2 illustrate an example of a rack mounted array 10 of liquid submersion cooled electronic devices 12. The devices 12 are mounted on a rack 14 in such a manner that the array 10 includes at least two vertical levels A, B . . . n, and each vertical level includes at least one of the electronic devices 12. In the illustrated example, there are eight (8) vertical levels and eight (8) devices 12 within each level.

In the illustrated example, the devices 12 are LSS's and the following description will describe the devices 12 as LSS's. However, the concepts described herein can be used in other applications where arrays of electronic devices are liquid submersion cooled, including, but not limited to, blade servers, disk arrays/storage systems, solid state memory devices, storage area networks, network attached storage, storage communication systems, routers, telecommunication infrastructure/switches, wired, optical and wireless communication devices, cell processor devices, printers, power supplies, etc.

As described further in U.S. Pat. Nos. 7,905,106, 7,911, 793, and 8,089,764, which are incorporated herein by reference in their entirety, each LSS includes a sealed, liquid-tight case that includes a single logic board or a plurality of logic boards disposed within the interior space. The logic board(s) includes a number of heat-generating electronic components, including at least one processor, for example, a CPU or a GPU. The case includes a liquid inlet port and a liquid outlet port through which cooling liquid is introduced into and removed from the interior space. In use, the case contains therein a cooling liquid that submerges the heat generating components of the LSS so that the submerged components are in direct contact with the cooling liquid inside the case. After exchanging heat with the electronic components, the cooling liquid is removed via the liquid outlet port, cooled in a heat exchanger, and cooled liquid is then returned to the case via the liquid inlet port.

The cooling liquid can be, but is not limited to, a dielectric liquid. The cooling liquid can be single phase or two-phase. It is preferred that the cooling liquid have a high enough thermal transfer capability to handle the amount of heat being generated by the submerged components so that the cooling liquid does not change state. Enough of the liquid is present in each case in order to submerge the heat generating components that one wishes to submerge. So in some instances the liquid may fill substantially the entire case 12, while in other instances the liquid may only partially fill the case 12.

A fluid delivery system 20, described further below, is used to deliver the cooling liquid through the system. Due to the elevation of the different levels A, B, . . . n in the rack (static head) and cumulative pressure drops due to frictional losses along the flow path of the liquid for each location of each device 12 within the array 10, the delivery of the liquid coolant at the required flow rates and pressures is made more difficult. The fluid delivery system 20 is designed to compensate for these difficulties. The fluid delivery system 20 is a sealed system instead of being directly vented to atmosphere.

The fluid delivery system 20 is designed to allow for a pumping system thereof to generate pressure and flow of the cooling liquid at slightly higher levels than is necessary for the worst case device 12 position within the array (i.e. those devices within the array which are at the highest elevation and/or experiencing the greatest pressure drops and flow reductions due to their remote proximity relative to the pump) and to provide for uniform delivery pressure and coolant flow to each and every device 12 within the array 10.

Figure 4:
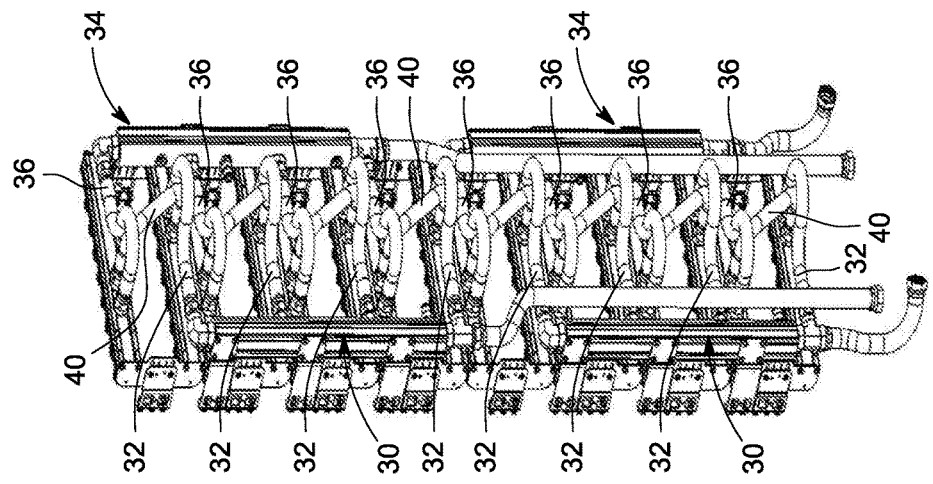
FIG. 4 is a rear perspective view of the fluid delivery system of FIG. 3.
Figure 5:
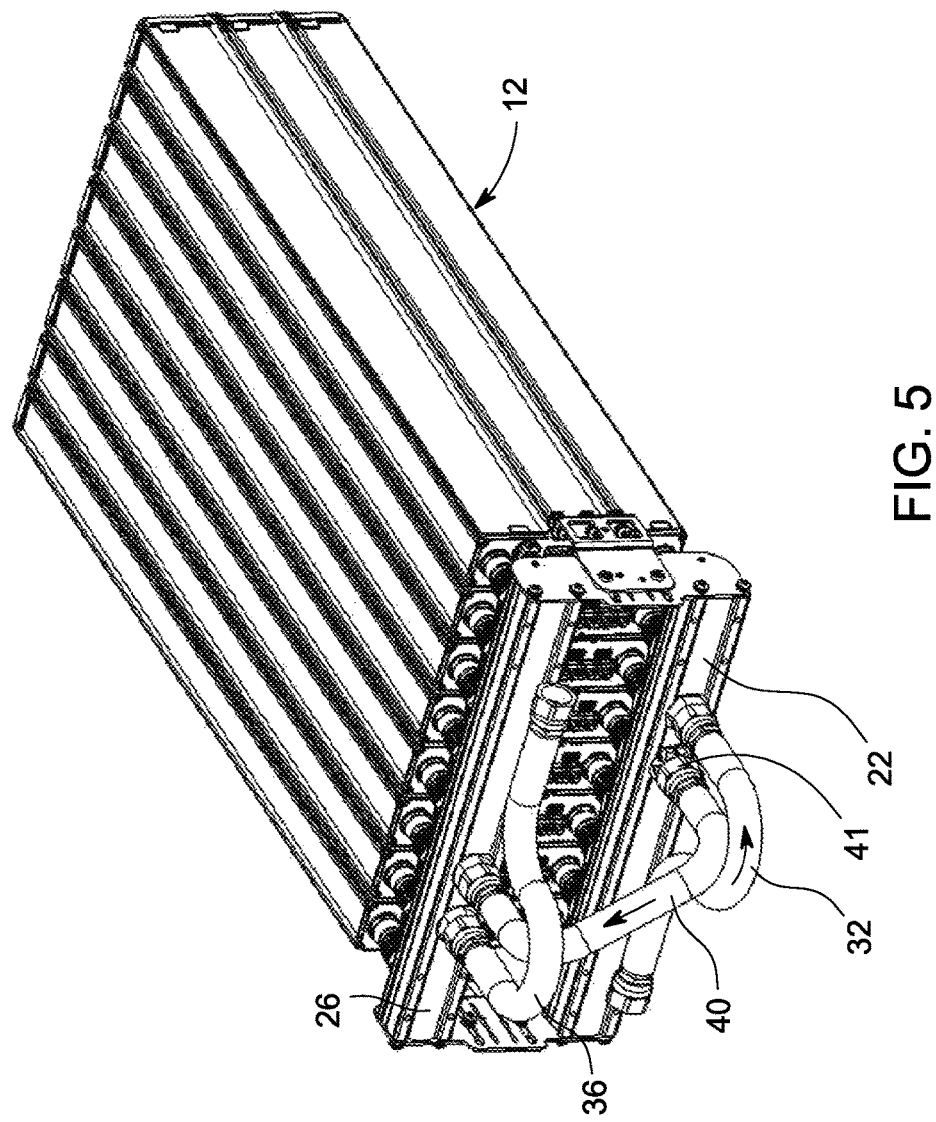
FIG. 5 is a rear perspective view of one vertical level of LSS's connected to a portion of the fluid delivery system.

With reference to FIGS. 3-5, the uniformity of delivery pressure and coolant flow is achieved through a plurality of unique features. These features can be used individually, collectively, or in any combination.

In particular, as shown in FIGS. 3-5, each vertical level A, B . . . n, can include a horizontal delivery manifold 22 that is configured to fluidly connect multiple devices 12 at each level at uniform delivery static pressure. As seen in FIG. 3, each delivery manifold 22 includes a plurality of ports 24 that in use connect to the liquid inlet ports on the devices 12. The ports 24 and the liquid inlet ports on the devices can each have quick connect valves that automatically open when a device 12 is connected to the delivery manifold 22 and that automatically close when a device 12 is removed.

Each vertical level A, B . . . n, can also include a horizontal return manifold 26 that is configured to fluidly connect multiple devices 12 at each level at uniform return static pressure. As seen in FIG. 3, each return manifold 26 includes a plurality of ports 28 that in use connect to the liquid outlet ports on the devices 12. The ports 28 and the liquid outlet ports on the devices can each have quick connect valves that automatically open when a device 12 is connected to the return manifold 26 and that automatically close when a device 12 is removed.

In addition, with reference to FIG. 4, the fluid delivery system 20 can include vertical delivery manifold(s) 30 that connect multiple levels of the devices 12 in the array at different static delivery pressures. The vertical delivery manifold(s) 30 can connect any number of levels (for example, 2, 3, 4, etc. levels), with the number of levels connected by the manifold(s) being based on factors that include, but are not limited to, the type of devices 12 being cooled, and the different flow requirements and power density cooling needs of the devices 12. As discussed further below, the fluid pressure delivered to each level will vary slightly as a result of the static head/column of cooling liquid above it. However, pressure relief/bypass valves disposed in by-pass lines regulate the pressure at each level to the same net pressure as one another.

A plurality of delivery lines 32 deliver liquid from the vertical delivery manifolds 30 to the horizontal delivery manifolds 22. The delivery lines 32 can connect to the delivery manifolds 22 at any lateral locations on the delivery manifolds 22. The illustrated example shows the delivery lines 32 connecting to the delivery manifolds 22 at the same lateral locations offset from center. However, in some embodiments, it may be appropriate to connect to each delivery manifold 22 at different lateral locations, or to connect to each delivery manifold 22 at the lateral center of each delivery manifold 22.

The fluid delivery system 20 can further include vertical return manifold(s) 34 that connect multiple shelves of the devices 12 in the array at different static return pressures. In the illustrated example, the shelves of the devices serviced by the vertical delivery manifold(s) 30 corresponds to the same shelves of the devices serviced by the vertical return manifold(s) 34. A plurality of return lines 36 deliver liquid from the horizontal return manifolds 26 to the vertical return manifolds 34. The return lines 36 can connect to the return manifolds 26 at any lateral locations on the manifolds 26. The illustrated example shows the return lines 36 connecting to the manifolds 26 at the same lateral locations offset from center. However, in some embodiments, it may be appropriate to connect to each manifold 26 at different lateral locations, or to connect to each manifold 26 at the lateral center of each manifold 26.

In an embodiment, a reverse return construction can be used on the vertical delivery manifold(s) 30, the vertical return manifold(s) 34, or both. For example, cooling fluid can be input to the top of the vertical delivery manifold(s) 30 and cooling fluid returned from the bottom of the vertical return manifold(s). Such a reverse return construction can help to minimize pressure drop within the system. In addition, the various delivery and return lines can be sized relative to one another to further minimize pressure drop.

As best seen in FIGS. 4 and 5, the delivery lines 32 and the return lines 36 are arranged in a horizontal plane coplanar with the manifolds 22, 26, and are parallel to each other. This creates parallel flow paths between groups of the horizontal delivery manifolds 22 and horizontal return manifolds 26 to help balance static pressures. In addition, this creates parallel flow paths between sets of the vertical delivery manifolds 30, 34 to help balance static pressures. In addition, arranging the lines 32, 36 in a horizontal plane minimizes the degree to which the lines 32, 36 will obstruct access to the rear panels of the electronic devices connected to the fluid distribution system.

Functionally, this is not required to achieve the intended flow of the liquid coolant, but from a pragmatic point of view, it is important to provide access to the rear panels of many electronic devices to allow for connection of power cables, I/O cables, etc. to the device ports that may be present The fluid delivery system 20 can also include pressure relief liquid by-pass lines 40 that directly fluidly interconnect the delivery manifold 22 and the return manifold 26 at each "shelf" or "elevation" within the array, as shown in FIG. 5. The by-pass lines 40 can connect to the manifolds 22, 26 at any locations on the manifolds 22, 26.

Each by-pass line 40 includes a pressure and/or flow regulating device 41 which helps establish appropriate pressure thresholds and flow capacities through the by-pass lines 40. In one embodiment, the regulating devices 41 are located at the points where the lines 40 connect to the delivery manifolds 22. However, in other embodiments the regulating devices 41 can be located at the points where the lines connect to the return manifolds 26, or located anywhere along the length of the lines 40. Examples of regulating devices include, but are not limited to, spring actuated valves and sensor based actuated regulating devices. In one embodiment, the regulating devices 41 can be manually and/or automatically adjusted to allow adjustment of the pressure and/or flow regulating characteristics of the devices 41.

The regulating devices 41 regulate locally the pressure and/or flow of the liquid being delivered to the devices 12 within the array 10 that share that level or "elevation" within the array. The desire to regulate pressure thresholds and flow capacities is based on the need to be able to allow for enough fluid flow and associated pressure relief for that particular level of devices 12 to regulate the delivered flow when only one device 12 is connected to that level without creating an over-pressure or under-pressure situation that would compromise the enclosure of that one device beyond its' design points for both pressure and minimum/maximum flow.

For example, in the illustrated example showing eight LSS's per shelf, and assuming that each LSS requires about 0.5 gallons/minute of coolant flow and has an engineered design point targeting no more than about 3 psi gauge (psig) pressure for each LSS housing, the regulating device 41 and the line 40 must be able to divert enough incoming cooling liquid to the return horizontal manifold 26 to compensate for the flow that would otherwise have been servicing the other seven LSS devices on that level. In other words, the bypass circuit formed by elements 40, 41 must be capable of diverting up to ⅞ths of the maximum coolant flow intended for the level of devices 12 at each elevation and regulating the residual flow at the inlet to the single device on the level to no more than 3 psig. The regulating device 41 and the line 40 must not, however, divert significantly more flow than referenced or it will reduce the ability of the overall system to deliver adequate flow and pressure characteristics to other levels sharing the same vertical manifold 34 but at higher elevations within the rack.

It is to be realized that the type of devices 12, the specific number of devices 12 on each level, the flow rate, and the pressure in the preceding paragraph are exemplary only. The specific limits will vary with different devices 12, the number of devices 12, and the construction of the device housings connected to the fluid delivery system, because each device will have unique power density and cooling requirements which affect fluid flow requirements and each device housing design will have its' own unique maximum pressure limit capability and internal flow pressure drop.

Turning to FIGS. 6-10, part of the fluid delivery system 20 can include a coolant distribution unit (CDU) 50 that can be mounted at the base of the rack 14 as shown in FIG. 10. The CDU 50 includes a pair of pumps 52a, 52b, a filtering unit 54 for filtering the cooling liquid, a filter distribution manifold 56, a return manifold 58 connected to the vertical return manifold(s) 34, a delivery manifold 60 connected to the vertical delivery manifold(s) 30, a heat exchanger inlet manifold 62, and a pair of heat exchanger units 64a, 64b. As seen in FIG. 10, a separate fluid circuit with hot and cold flow lines 66 extend from the CDU for directing fluid, for example water, from a separate heat exchange circuit for exchanging heat with the cooling fluid that flows through the heat exchanger units 64a, 64b of the CDU.

In use, returning heated coolant from the vertical return manifolds flows into the manifold 58 and then to the inlets of the pumps 52a, 52b. The outlets of the pumps are connected to pump distribution manifolds 68a, 68b, with the coolant then flowing into the distribution manifold 56. From the distribution manifold 56 the coolant flows into the filtering unit 54 for filtering the coolant and then into the heat exchanger manifold 62. Alternatively, flow through the filtering unit 54 can be shut-off using suitable valves, for example when changing the filter in the unit 54, with the flow then being directed through a by-pass line 70 connected to the heat exchanger manifold 62.

From the heat exchanger manifold 62, coolant flows into each of the heat exchanger units 64a, 64b to cool the coolant. The now cooled coolant then flows from each heat exchanger unit to the delivery manifold 60 for delivery to the vertical delivery manifolds 30.

The components of the CDU are arranged in the flow path in a manner to regulate pressure provided to the remainder of the fluid delivery system 20. This helps to minimize the static pressure in the remainder of the fluid delivery system 20 and, ultimately the static pressure of the LSS devices 12.

In addition, the CDU 50 permits change out of one of the pumps and/or heat exchangers while coolant is still delivered to the array using the remaining pump and heat exchanger.

One problem solved by the fluid delivery system 20, including the by-pass circuits 40, 41, relates to the initial fluid provisioning of the fluid delivery system 20. When the CDU 50 and the remainder of the fluid delivery system 20 are initially installed, there is no flow path between the inlet and outlet flow paths of the fluid delivery system when no devices 12 are installed. This creates a problem for the pump 52 as there is no path for flow to occur as the inlet and outlet systems are independent (i.e. not fluidly connected to one another). Only when one or more devices 12 are installed is a fluid connection between inlet and outlet flow paths made. When the first device 12 is installed, if no flow management provisions are made within the system, the CDU 50 would attempt to force all the flow from the pump through that one device. This would result in extremely high pressure and flow being delivered to a single device, which could damage the device 12 and/or cause fluid leakage from the device 12.

The sealed fluid delivery system 20 is designed so that the various flow restrictions provided by devices such as the pump(s), filter(s), heat exchanger(s), devices 12, manifolds, etc. result in the internal gauge pressure of the devices 12 being regulated, reducing the range in pressure change with respect to changes in pump speed. This will protect the enclosures of the electronic devices 12 and allow for simplified "pressure vessel" design of the enclosures. To help illustrate this concept, the following is an example. This is an example only and is not to be construed as being limiting of the invention.

Example (Approximate Values)

When the pump is at minimum speed:
The inlet pump pressure: 0 psi
Outlet pump pressure: 2.5 psi
Device 12 internal pressure: 1 psi
The pump increased to max speed:
Inlet pump pressure: −3 psi
Outlet pump pressure: 20 psi
Device 12 internal pressure: 1.5 psi
Exposed pressure range to each device 12 at a constant operating temperature:
1 to 1.5 psi (varies slightly by elevation and the range can be fine-tuned with the pressure and/or flow settings for the bypass circuits for each location in the rack)

Although the use of the coolant distribution unit (CDU) 50 has been described, other pumping schemes could be used. For example, a distributed network of pumps can be used to pump the coolant to the devices in the array.

With the system 20 described herein, portions of the system can be operated at "sub-ambient" pressure levels. In one embodiment, the hoses used in the system can be "non-collapsible" at target pressure levels.

To aid in coolant flow and the desired pressure regulation described above, the devices 12 in the array 10 can be designed with similar impedance/pressure drop versus flow characteristics.

The system described herein can also create "zones" within the system that can deliver different levels of uniform coolant flow to all the devices 12 within those zones. In addition, pressure bypass schemes help to regulate "delta P" locally and at different elevations within the array 10.

In another embodiment, expansion chambers can be used with or without regulated air chamber pressure/vacuum provisions.

The concepts described may be embodied in other forms without departing from the spirit or novel characteristics thereof. The examples disclosed in this application are to be considered in all respects as illustrative and not limitative.

The invention claimed is:

1. A system, comprising:
a plurality of electronic devices arranged side-by-side in a lateral direction on a shelf, each electronic device of the plurality of electronic devices includes a liquid-tight case and heat generating electronic components within the liquid-tight case, each of the liquid-tight cases includes a liquid inlet port and a liquid outlet port;
each of the electronic devices being configured for liquid submersion cooling by a cooling liquid;
a cooling liquid delivery manifold fluidly connected to the liquid inlet port of each of the liquid-tight cases;
a cooling liquid return manifold fluidly connected to the liquid outlet port of each of the liquid-tight cases;
a bypass line that fluidly connects the cooling liquid delivery manifold and the cooling liquid return manifold;
a pressure regulating device in the bypass line that regulates a pressure through the bypass line, wherein a fluid pressure of the cooling liquid in each of the electronic devices is substantially the same.

2. The system of claim 1, wherein the electronic devices comprise servers, disk arrays/storage systems, solid state memory devices, storage area networks, network attached storage, storage communication systems, routers, telecommunication infrastructure/switches, wired, optical and wireless communication devices, cell processor devices, printers, or power supplies.

3. A system, comprising:
a rack that includes a plurality of shelves defining a plurality of vertical levels;
on each one of the shelves, a plurality of electronic devices are arranged, each electronic device of the plurality of electronic devices includes a liquid-tight case and heat generating electronic components within the liquid-tight case, each of the liquid-tight cases includes a liquid inlet port and a liquid outlet port, and each one of the electronic devices being configured for liquid submersion cooling by a cooling liquid;

at each one of the vertical levels, a cooling liquid delivery manifold is fluidly connected to the liquid inlet port of each of the liquid-tight cases;

at each one of the vertical levels, a cooling liquid return manifold is fluidly connected to the liquid outlet port of each of the liquid-tight cases;

at each one of the vertical levels, a bypass line fluidly connects the cooling liquid delivery manifold and the cooling liquid return manifold;

at each one of the vertical levels, a pressure regulating device is in the bypass line that regulates a pressure through the bypass line, wherein a fluid pressure of the cooling liquid in each of the electronic devices is substantially the same.

4. The system of claim 3, wherein the electronic devices comprise servers, disk arrays/storage systems, solid state memory devices, storage area networks, network attached storage, storage communication systems, routers, telecommunication infrastructure/switches, wired, optical and wireless communication devices, cell processor devices, printers, or power supplies.

5. A method of cooling an array of electronic devices using liquid submersion in a cooling liquid, the array of the electronic devices being arranged side-by-side in a lateral direction on a shelf, the method comprising:

providing a fluid delivery system that delivers the cooling liquid to the array of electronic devices, the fluid delivery system having a cooling liquid delivery manifold that is fluidly connectable to each of the electronic devices, a cooling liquid return manifold that is fluidly connectable to each of the electronic devices, a bypass line fluidly interconnecting the cooling liquid delivery manifold and the cooling liquid return manifold, and a pressure regulating device in the bypass line that regulates a pressure through the bypass line; and using the pressure regulating device in the bypass line to provide for substantially uniform cooling liquid pressure to each electronic device of the array of electronic devices.

6. The method of claim 5, wherein the electronic devices comprise servers, disk arrays/storage systems, solid state memory devices, storage area networks, network attached storage, storage communication systems, routers, telecommunication infrastructure/switches, wired, optical and wireless communication devices, cell processor devices, printers, or power supplies.

* * * * *